(12) United States Patent
Han et al.

(10) Patent No.: US 11,469,256 B2
(45) Date of Patent: Oct. 11, 2022

(54) ARRAY SUBSTRATE, DISPLAY PANEL AND DISPLAY DEVICE

(71) Applicants: Hefei Xinsheng Optoelectronics Technology Co., Ltd., Hefei (CN); BOE TECHNOLOGY GROUP CO., LTD., Beijing (CN)

(72) Inventors: Ling Han, Beijing (CN); Tao Ma, Beijing (CN); Chengshao Yang, Beijing (CN); Qingmeng Wu, Beijing (CN)

(73) Assignees: HEFEI XINSHENG OPTOELECTRONICS TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 273 days.

(21) Appl. No.: 16/831,144

(22) Filed: Mar. 26, 2020

(65) Prior Publication Data

US 2021/0151469 A1    May 20, 2021

(30) Foreign Application Priority Data

Nov. 15, 2019 (CN) .......................... 201921986690.7

(51) Int. Cl.
*G02F 1/136* (2006.01)
*H01L 27/12* (2006.01)
*H01L 23/60* (2006.01)

(52) U.S. Cl.
CPC ............ *H01L 27/124* (2013.01); *G02F 1/136* (2013.01); *H01L 23/60* (2013.01)

(58) Field of Classification Search
CPC ... G02F 1/136204; G02F 1/136; H01L 27/124
See application file for complete search history.

(56) References Cited

U.S. PATENT DOCUMENTS

2008/0079859 A1* 4/2008 Ota .................. G02F 1/136204
349/40

FOREIGN PATENT DOCUMENTS

CN            103296021            9/2013

OTHER PUBLICATIONS

1st Office Action dated Apr. 15, 2020 for Chinese Patent Application No. 201921986690.7.

* cited by examiner

*Primary Examiner* — James A Dudek
(74) *Attorney, Agent, or Firm* — Xsensus, LLP

(57) ABSTRACT

An array substrate includes a base substrate and a GND trace. The GND trace is disposed along an edge of the substrate, and the GND trace includes a plurality of conductive line segments separated from each other and a connection structure disposed on a side of the GND trace away from the base substrate. The connection structure electrically connects the conductive line segments.

13 Claims, 2 Drawing Sheets

ARRAY SUBSTRATE, DISPLAY PANEL AND DISPLAY DEVICE

CROSS REFERENCE TO RELATED APPLICATIONS

This application claims the benefit of and priority to Chinese Patent Application No. 201921986690.7, filed on Nov. 15, 2019, the contents of which are incorporated herein by reference in its entirety.

TECHNICAL FIELD

The present disclosure relates to the field of display technologies and, in particular, to an array substrate, a display panel mounted with the array substrate, and a display device mounted with the display panel.

BACKGROUND

An array substrate is an important component of a display device. An array substrate generally includes a base substrate and a multi-layer conductive structure formed on the base substrate.

At present, high aperture advanced super dimensional switching (HADS) products may present advantages of high aperture ratio and wide viewing angle of 178°. However, such product is prone to electro-static discharge (ESD), which affects the product yield of the array substrate.

Therefore, there is a demand to study an array substrate, a display panel mounted with the array substrate, and a display device mounted with the display panel.

The above information disclosed in the background section is only used to enhance the understanding of the background of the present disclosure, so it may include information that does not constitute the prior art known to those of ordinary skill in the art.

SUMMARY

Additional aspects and advantages of the present disclosure will be set forth in part in the following description, and will become apparent in part from the description, or can be learned through the practice of the present disclosure.

According to an aspect of the present disclosure, an array substrate is provided, including:

a base substrate; a GND trace, disposed along edges of the substrate, the GND trace comprising a plurality of conductive line segments separated from each other; and a connection structure disposed on a side of the GND trace away from the base substrate, and the connection structure electrically connecting the conductive line segments.

In an example embodiment of the present disclosure, the array substrate further includes:

a first insulating layer disposed on a side of the GND trace away from the base substrate; and a first electrode layer disposed on a side of the first insulating layer away from the base substrate;

wherein the connection structure is disposed on a side of the first electrode layer away from the base substrate, and the connection structure electrically connects two adjacent conductive line segments.

In an example embodiment of the present disclosure, wherein the connection structure includes:

a first via hole (or a plurality of first via holes) disposed on the first insulating layer, wherein an orthographic projection of the first via hole on the base substrate covers an orthographic projection of an interval between two adjacent conductive line segments on the base substrate;

a second insulating layer disposed on a side of the first electrode layer away from the base substrate, wherein a second via hole (or a plurality of second via holes) are disposed on the second insulating layer, and an orthographic projection of the second via hole on the base substrate covers an orthographic projection of the interval between two adjacent conductive line segments on the base substrate; and a first connection portion disposed on a side of the second insulating layer away from the base substrate, wherein the first connection portion electrically connects two adjacent conductive line segments through the second via hole and the first via hole.

In an example embodiment of the present disclosure, the array substrate further includes:

a cell test (CT) pad, disposed on the base substrate and disposed on the same layer as the GND trace;

wherein the connection structure further comprises:

a fourth via hole (or a plurality of fourth via holes) disposed on the first insulating layer and a fifth via hole (or a plurality of fifth via holes) disposed the first electrode layer, the fifth via hole being in communication with the fourth via hole, and a third via hole (or a plurality of third via holes) being disposed on the second insulating layer;

a second connection portion disposed in the fourth via hole and the fifth via hole, to electrically connect the CT pad and the first electrode layer; and a third connection portion disposed on a side of the second insulating layer away from the base substrate, and the third connection portion being electrically connected to the second connection portion through the third via hole.

In an example embodiment of the present disclosure, the third connection portion and the first connection portion are disposed on a same layer as a common electrode of a display area.

In an example embodiment of the present disclosure, the first electrode layer is disposed on a same layer as the pixel electrode of the display area.

In an example embodiment of the present disclosure, four intervals are disposed on the GND traces.

In an example embodiment of the present disclosure, the four intervals are disposed at four corners of the GND trace in a one-to-one correspondence.

In an example embodiment of the present disclosure, an opening portion is disposed on the GND trace.

In an example embodiment of the present disclosure, the opening portion is disposed on a DP side of the array substrate.

In an example embodiment of the present disclosure, the interval between two adjacent conductive line segments has a length larger than 5 mm, and smaller than or equal to 10 mm.

According to an aspect of the present disclosure, a display panel is provided, including:

an array substrate according to any one the above-described embodiments.

According to an aspect of the present disclosure, a display device is provided, including:

a display panel as described above.

BRIEF DESCRIPTION OF THE DRAWINGS

The above and other features and advantages of the present disclosure will become more apparent from description of example embodiments thereof in detail with reference to accompanying drawings.

DETAILED DESCRIPTION

Figure 1:
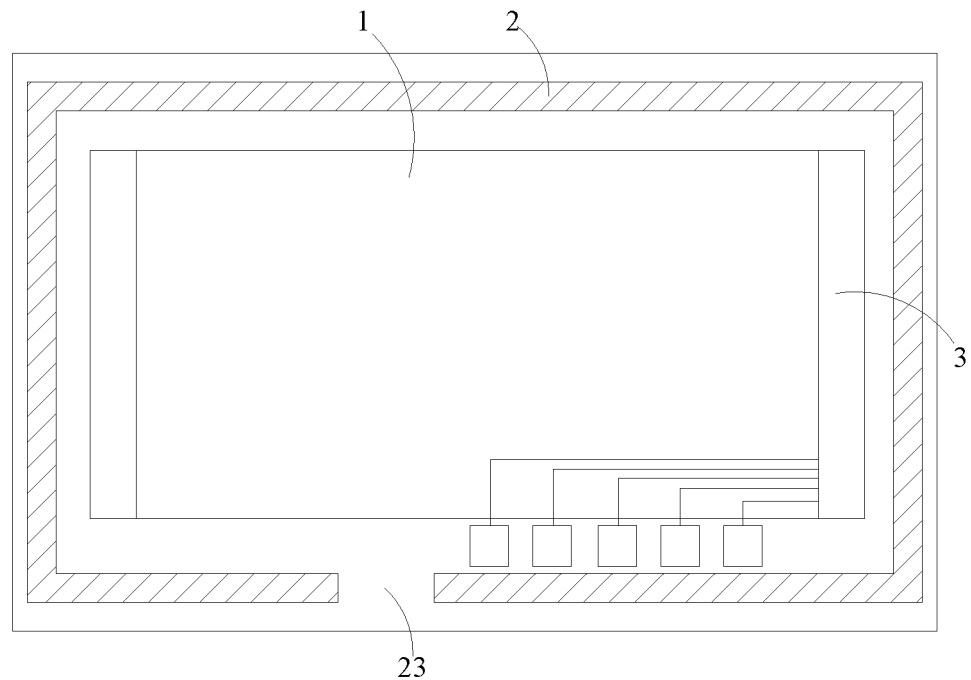
FIG. 1 is a schematic structural diagram illustrating an array substrate in the related art.

Example embodiments will now be described more fully with reference to the accompanying drawings. However, the example embodiments can be implemented in various forms and should not be construed as limited to the embodiments set forth herein. Rather, these embodiments are provided so that the present disclosure will be thorough and complete, and will fully convey the concept of the example embodiments to those skilled in the art. The same reference numerals in the drawings denote the same or similar structures and thus, their detailed descriptions will be omitted.

Referring to the schematic diagram illustrating the structure of the array substrate in the related art shown in FIG. 1, the array substrate can include a display area and a non-display area located around the display area 1, and a ground (GND)) trace 2 and a gate-driver-on-array (GOA) drive circuit 3 are provided in the non-display area. The display area 1 is disposed in the middle of the array substrate. A loop of GND trace 2 is disposed around the periphery of the array substrate. The purpose of providing GND trace 2 is to quickly discharge static electricity through the GND trace 2 when an electrostatic voltage is generated, so as to prevent the accumulation of static electricity which causes damage to the inside of the panel and affects the display. However, the GND trace 2 has a limited function of releasing static electricity. When the electrostatic voltage is too high, it will cause the GND metal trace to be injured, even affecting the internal circuits, and causing poor display. Especially for an array substrate, where a gate layer is directly in contact with a base substrate 4, static electricity is mainly concentrated on the gate layer. Also, since the GND trace 2 is an independent trace formed by the same patterning process as the gate layer and the independent GND trace 2 is rather long, more static electricity may accumulate on the GND trace 2, causing the first electrode layer 7 and the GND trace 2 to form a potential difference, which is prone to ESD, affecting the product yield of the array substrate.

Figure 2:
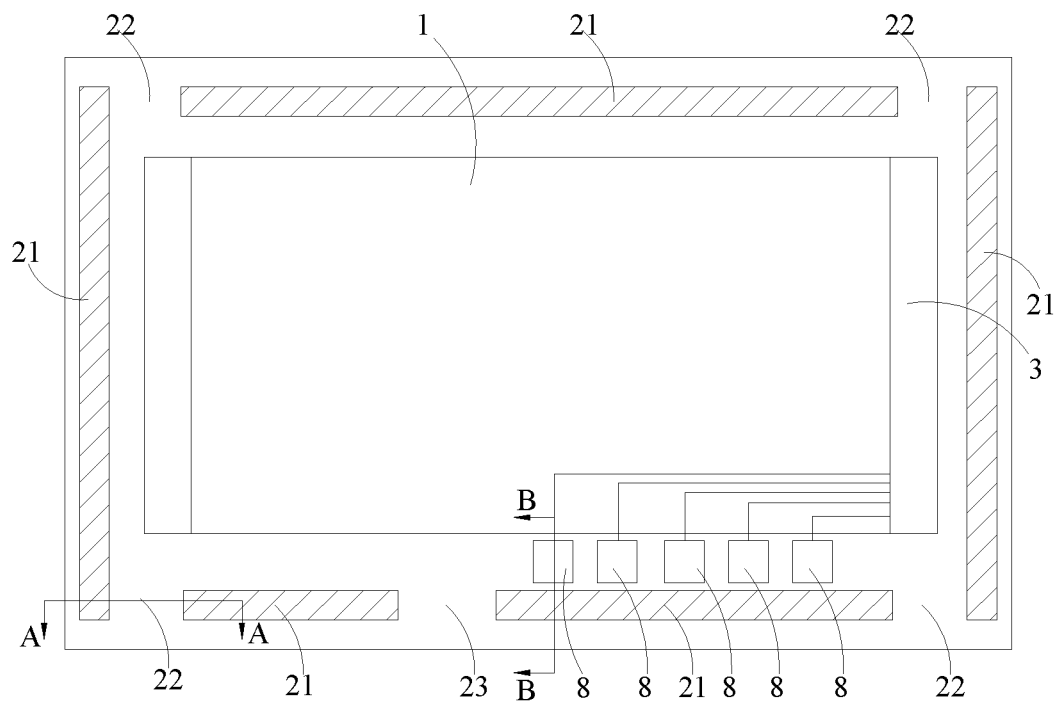
FIG. 2 is a schematic structural diagram illustrating an array substrate according to an embodiment of the present disclosure.

The present disclosure provides an array substrate. Referring to FIG. 2, a schematic structural diagram illustrating an array substrate of an embodiment of the present disclosure is shown. The array substrate includes a base substrate 4, a GND trace 2, a first insulating layer 51, a first electrode layer 7, and a connection structure. The GND trace 2 is provided along an edge of the base substrate 4, and the GND trace 2 includes a plurality of conductive line segments 21 disposed separated from each other. The first insulating layer 51 is disposed on a side of the GND trace 2 away from the base substrate 4. The first electrode layer 7 is disposed on a side of the first insulating layer 51 away from the base substrate 4. The connection structure is disposed on the side away from the first electrode layer 7. The connection structure can electrically connect two adjacent conductive line segments 21.

In the present example embodiment, the base substrate 4 can be a glass substrate. A first conductive layer is formed on the base substrate 4, the first conductive layer can be used to form a gate electrode in the display area 1 and to form a GND trace 2 in the non-display area through the same patterning process.

In the present example embodiment, the GND trace 2 has an opening portion 23, which is a disconnected portion. The opening portion 23 makes the GND trace 2 form a non-closed loop structure. The opening portion 23 has a length of approximately 5 mm to 10 mm, and the opening portion 23 is located on the DP (date pad) side. The date pad (DP) refers to four sides of a display panel. The function of providing the opening portion 23 is to facilitate the release of static electricity. However, in other example embodiments of the present disclosure, the opening portion 23 can be provided on a date pad opposite (DPO) side, a gate pad left (GPL) side, or a gate pad right (GPR) side.

In the present example embodiment, four intervals 22 are provided on the GND trace 2, and the four intervals 22 and the opening portion 23 make the GND trace 2 form five conductive line segments 21. The interval 22 on the GND trace 2 has a length of approximately 5 mm to 10 mm, or the conductive line segment 21 has a length of approximately 180 mm to 190 mm. The four intervals 22 are disposed respectively at four corners of the GND trace 2. The array substrate of the example embodiment is rectangular with four corner portions, and the GND trace 2 is disposed along the peripheral edge of the array substrate. Therefore, the GND trace 2 also has four corner portions. However, in other example implementations of the present disclosure, the interval 22 on the GND trace 2 can be provided less or more, for example, three, five, seven, or eight intervals 22 can be provided. The positions of the intervals 22 may not be provided at the corners, so long as the lengths of the plurality of conductive line segments 21 are substantially uniform.

To provide the GND trace 2 as a plurality of conductive line segments 21 separated from each other, no additional processes are required; however, only the mask used for forming the gate electrode and the GND trace 2 has to be modified. Therefore the cost will not be increased.

In the example embodiment, after the GND trace 2 is formed, the first insulating layer 51 is formed on a side of the GND trace 2 away from the base substrate 4. The first electrode layer 7 is then formed on the side of the first insulating layer 51 away from the base substrate 4. No first electrode layer 7 is disposed directly above the GND trace 2. That is, an orthographic projection of the first electrode layer 7 on the base substrate 4 and an orthographic projection of the GND trace 2 on the base substrate 4 do not overlap each other. The first electrode layer 7 can be formed by the same patterning process as the pixel electrode of the display area 1 of the array substrate. The material of the first electrode layer 7 can be indium tin oxide or other conductive materials.

Figure 3:
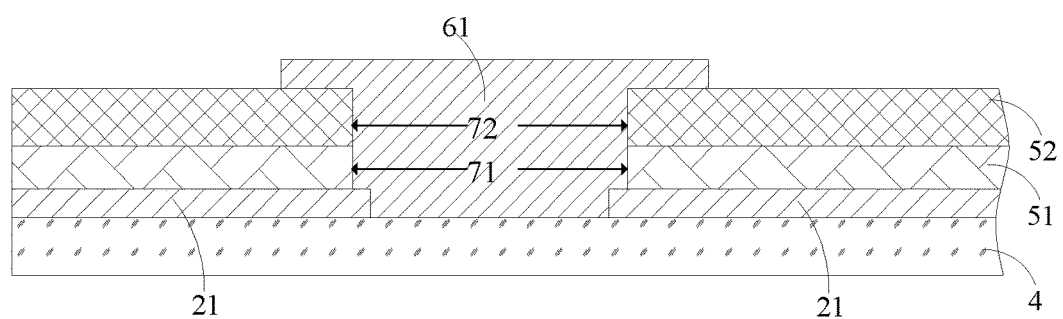
FIG. 3 is a schematic cross sectional view taken along A-A in FIG. 2.

In the example embodiment, the connection structure can include a second insulating layer 52, a first connection portion 61, and a first via hole 71 disposed on the first insulating layer 51. The second insulating layer 52 is disposed on a side of the first electrode layer 7 away from the base substrate 4. Since the first electrode layer 7 is not provided directly above the GND trace 2, the second insulating layer 52 directly above the GND trace 2 is bonded to the first insulating layer 51. Referring to FIG. 3 for a schematic cross sectional view taken along A-A in FIG. 2, the first via hole 71 is disposed on the first insulating layer 51, and a second via hole 72 is disposed on the second insulating layer 52. The first insulating layer 51 and the second insulating layer 52 can be patterned once to form the first via hole 71 on the first insulating layer 51 and the second via hole 72 on the second insulating layer 52. An orthographic projection of the first via hole 71 on the base substrate 4 covers an orthographic projection of the interval 22 between two adjacent conductive line segments 21 on the base substrate 4. That is, the orthographic projection of the first via hole 71 on the base substrate 4 is at the same position as the orthographic position of the interval 22 between two adjacent conductive line segments 21 on the base substrate 4, and the orthographic projection of the first via hole 71 on the base substrate 4 has an area larger than or equal to that of the orthographic position of the interval 22 between two adjacent conductive line segments 21 on the base substrate 4. An orthographic projection of the second via hole 72 on the base substrate 4 covers the orthographic projection of the interval 22 between two adjacent conductive line segments 21 on the base substrate 4. That is, the orthographic projection of the second via hole 72 on the base substrate 4 is at the same position as the orthographic position of the interval 22 between two adjacent conductive line segments 21 on the base substrate 4, and the orthographic projection of the second via hole 72 on the base substrate 4 has an area larger than or equal to that of the orthographic position of the interval 22 between two adjacent conductive line segments 21 on the base substrate 4. The second via hole 72 can have a size the same as or slightly larger than that of the first via hole 71, and the second via hole 72 is at a position the same as that of the first via hole 71. The first connection portion 61 is disposed on a side of the second insulating layer 52 away from the base substrate 4, and the first connection portion 61 electrically connects the two adjacent conductive line segments 21 through the second via hole 72 and the first via hole 71. The first connection portion 61 can be formed by the same patterning process as the common electrode of the display area 1 of the array substrate. The material of the first connection portion 61 can be indium tin oxide or other conductive materials. The first connection portion 61 is disposed at the uppermost layer of the array substrate, that is, the first connection portion 61 is formed at the last step, which can reduce the accumulation of static electricity generated in the previous process on the GND trace 2.

The GND trace 2 is designed in segments to form a plurality of conductive line segments 21 separated from each other, which can reduce the area of the GND trace 2, reduce the static electricity accumulated on the GND trace 2, and reduce the occurrence of ESD on the GND trace 2 and the conductive layer above the GND trace 2 which can, in turn, reduce damage caused by the accumulation of static electricity to the inside of the panel, and improve product yield.

Figure 4:
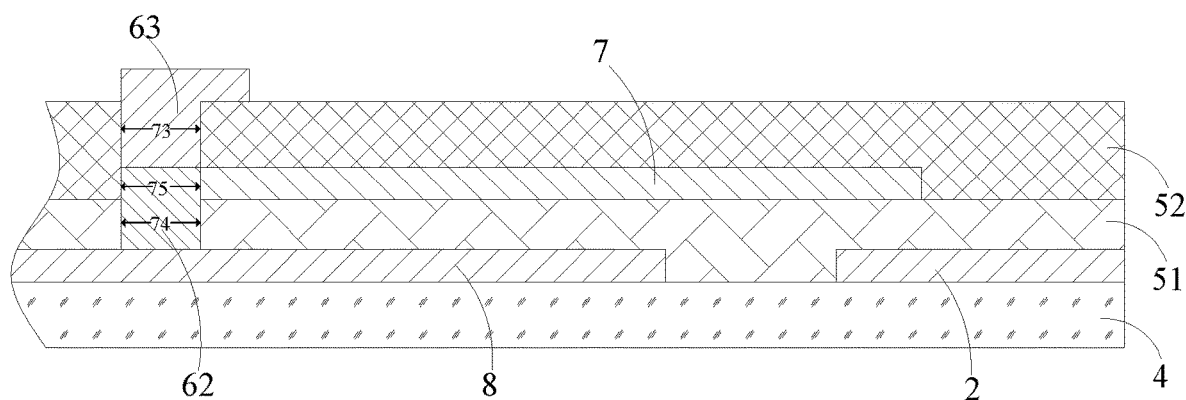
FIG. 4 is a schematic cross sectional view taken along B-B in FIG. 2.

Referring to the schematic cross sectional view taken along B-B in FIG. 2 shown in FIG. 4, a plurality of fourth via holes 74 are disposed on the first insulating layer 51, and a plurality of fifth via holes 75 are disposed on the first electrode layer 7. The fifth via hole 75 is in communication with the fourth via hole 74, and a plurality of third via holes 73 are disposed on the second insulating layer 52. The array substrate further includes a cell test pad (CT Pad) 8, a second connection portion 62, and a third connection portion 63. The CT pad 8 is disposed on the base substrate 4. The CT pad 8 can be disposed on the same layer as the GND trace 2 and the gate electrode of the display area 1. That is, the CT pad 8, the GND trace 2, and the gate electrode of the display area 1 are formed by the same patterning process. The second connection portion 62 is disposed in the fourth via hole 74 and the fifth via hole 75. The second connection portion 62 can be formed by the same patterning process as the source electrode and drain electrode of the display area 1 of the array substrate. The CT pad 8 is electrically connected to the first electrode layer 7 through the second connection portion 62. The third connection portion 63 is disposed on a side of the second insulating layer 52 away from the base substrate 4. The third connection portion 63 is electrically connected to the second connection portion 62 through the third via hole 73.

In the example embodiment, the third connection portion 63 and the first connection portion 61 can be disposed on the same layer. That is, the third connection portion 63 can be formed by the same patterning process as the common electrode of the first connection portion 61 and the display area 1 of the array substrate. Similarly, the material of the third connection portion 63 can be indium tin oxide, or other conductive materials. The third connection portion 63 is connected to the GOA driving circuit 3 and inputs a driving signal to the GOA driving circuit 3 through the CT pad 8, to drive the GOA driving circuit 3.

Further, the present disclosure also provides a display panel including the array substrate described above. The specific structure of the array substrate has been described in detail above, which will not be repeated herein.

Further, the present disclosure also provides a display device including the display panel described above. The display panel includes the array substrate described above. The specific structure of the array substrate has been described in detail above, which will not be repeated herein.

The features, structures, or characteristics described above can be combined in any suitable manner in one or more embodiments, and if possible, the features discussed in the embodiments are interchangeable. In the above description, many specific details are provided to give a full understanding of the embodiments of the present disclosure. However, those skilled in the art will realize that the technical solutions of the present disclosure can be practiced without one or more of the specific details, or other methods, components, materials, etc. can be adopted. In other instances, well-known structures, materials, or operations have not been shown or described in detail to avoid obscuring aspects of the present disclosure.

The terms "about" and "approximately" used in the present specification generally indicate a given value or within 20% of a range, preferably within 10%, and more preferably within 5%. The number given here is an approximate number, which means that the meanings of "about", "approximately", "substantially", and "generally" can be implied without specific instructions.

Although relative terms are used in the present specification, such as "above" and "below" to describe the relative relationship between one component and another component as illustrated. These terms are used in the present specification only for convenience, for example, according to orientation of the examples shown in the drawings. It can be understood that if the illustrated device is reversed and turned upside down, the component described "above" will become the component "below". Other relative terms, such as "high", "low", "top", "bottom", "front", "rear", "left" and "right", have similar meanings. When a structure is "on" another structure, it can mean that a structure is integrally formed on another structure, or that a structure is "directly" disposed on another structure, or that a structure is "indirectly" disposed on another structure through another structure.

In the present specification, the terms "a", "an", "the", and "said" are used to indicate the presence of one or more elements, components, or the like. The terms "comprising", "including", and "having" are used to mean open-ended inclusion and mean that there can be other elements, components, or the like in addition to the listed elements, components, or the like. The terms "first", "second", and "third" or the like are only used as references, not as a limit on the number of the objects.

It should be understood that the present disclosure does not limit its application to the detailed structure and arrangement of the components provided in the present specification. The present disclosure may have other embodiments and may be practiced and carried out in various ways. The aforementioned variations and modifications fall within the scope of the present disclosure. It should be understood that the disclosure disclosed and defined by the present specification extends to all alternative combinations of two or more separate features mentioned or apparent in the text and/or drawings. All of these different combinations constitute various alternative aspects of the present disclosure. The embodiments described in the present specification illustrate the best modes known for implementing the present disclosure and will enable others skilled in the art to utilize the present disclosure.

What is claimed is:

1. An array substrate comprising:
    a base substrate;
    a ground (GND) trace disposed along edges of the substrate, the GND trace comprising a plurality of conductive line segments separated from each other;
    a connection structure disposed on a side of the GND trace away from the base substrate, wherein the connection structure electrically connects the conductive line segments;
    a first insulating layer disposed on a side of the GND trace away from the base substrate; and
    a first electrode layer disposed on a side of the first insulating layer away from the base substrate;
    wherein the connection structure is disposed on a side of the first electrode layer away from the base substrate, the connection structure electrically connecting two adjacent conductive line segments, and
    the connection structure comprises:
    a first via hole disposed on the first insulating layer, wherein an orthographic projection of the first via hole on the base substrate covers an orthographic projection of an interval between two adjacent conductive line segments on the base substrate;
    a second insulating layer disposed on a side of the first electrode layer away from the base substrate, wherein a second via hole is disposed on the second insulating layer, and an orthographic projection of the second via hole on the base substrate covers an orthographic projection of the interval between two adjacent conductive line segments on the base substrate; and
    a first connection portion disposed on a side of the second insulating layer away from the base substrate, wherein the first connection portion electrically connects two adjacent conductive line segments through the second via hole and the first via hole.

2. The array substrate according to claim 1, further comprising:
    a cell test (CT) pad disposed on the base substrate and disposed on the same layer as the GND trace;
    wherein the connection structure further comprises:
    a fourth via hole disposed on the first insulating layer, a fifth via hole disposed the first electrode layer, the fifth via hole being in communication with the fourth via hole, and a third via hole being disposed on the second insulating layer;
    a second connection portion disposed in the fourth via hole and the fifth via hole to electrically connect the CT pad and the first electrode layer; and
    a third connection portion disposed on a side of the second insulating layer away from the base substrate, and the third connection portion being electrically connected to the second connection portion through the third via hole.

3. The array substrate according to claim 2, wherein the third connection portion and the first connection portion are disposed on a same layer as a common electrode of a display area.

4. The array substrate according to claim 1, wherein the first electrode layer is disposed on a same layer as a pixel electrode of the display area.

5. The array substrate according to claim 1, wherein four intervals are disposed on the GND traces.

6. The array substrate according to claim 5, wherein the four intervals are disposed at four corners of the GND trace in one-to-one correspondence.

7. The array substrate according to claim 1, wherein an opening portion is disposed on the GND trace.

8. The array substrate according to claim 7, wherein the opening portion is disposed on a date pad (DP) side of the array substrate.

9. The array substrate according to claim 1, wherein the interval between two adjacent conductive line segments has a length larger than 5 mm, and smaller than or equal to 10 mm.

10. A display panel comprising an array substrate, the array substrate comprising:
    a base substrate;
    a ground (GND) trace disposed along an edge of the substrate, the GND trace comprising a plurality of conductive line segments separated from each other;
    a connection structure disposed on a side of the GND trace away from the base substrate, the connection structure electrically connecting the conductive line segments;
    a first insulating layer disposed on a side of the GND trace away from the base substrate; and
    a first electrode layer disposed on a side of the first insulating layer away from the base substrate;
    wherein the connection structure is disposed on a side of the first electrode layer away from the base substrate, the connection structure electrically connecting two adjacent conductive line segments, and
    the connection structure comprises:
    a first via hole disposed on the first insulating layer, wherein an orthographic projection of the first via hole on the base substrate covers an orthographic projection of an interval between two adjacent conductive line segments on the base substrate;
    a second insulating layer disposed on a side of the first electrode layer away from the base substrate, wherein a second via hole is disposed on the second insulating layer, and an orthographic projection of the second via hole on the base substrate covers an orthographic projection of the interval between two adjacent conductive line segments on the base substrate; and
    a first connection portion disposed on a side of the second insulating layer away from the base substrate, wherein the first connection portion electrically connects two adjacent conductive line segments through the second via hole and the first via hole.

11. The display panel according to claim 10, wherein the array substrate further comprises:

a cell test (CT) pad disposed on the base substrate and disposed on the same layer as the GND trace;

wherein the connection structure further comprises:

a fourth via hole disposed on the first insulating layer, a fifth via hole disposed the first electrode layer, the fifth via hole being in communication with the fourth via hole, and a third via hole being disposed on the second insulating layer;

a second connection portion disposed in the fourth via hole and the fifth via hole to electrically connect the CT pad and the first electrode layer; and a third connection portion disposed on a side of the second insulating layer away from the base substrate, the third connection portion being electrically connected to the second connection portion through the third via hole.

12. The display panel according to claim 11, wherein the third connection portion and the first connection portion are disposed on the same layer as a common electrode of a display area.

13. A display device comprising a display panel, the display panel comprising an array substrate, and the array substrate comprising:

a base substrate;

a ground (GND) trace disposed along an edge of the substrate, the GND trace comprising a plurality of conductive line segments separated from each other;

a connection structure disposed on a side of the GND trace away from the base substrate, the connection structure electrically connecting the conductive line segments;

a first insulating layer disposed on a side of the GND trace away from the base substrate; and a first electrode layer disposed on a side of the first insulating layer away from the base substrate;

wherein the connection structure is disposed on a side of the first electrode layer away from the base substrate, the connection structure electrically connecting two adjacent conductive line segments, and the connection structure comprises:

a first via hole disposed on the first insulating layer, wherein an orthographic projection of the first via hole on the base substrate covers an orthographic projection of an interval between two adjacent conductive line segments on the base substrate;

a second insulating layer disposed on a side of the first electrode layer away from the base substrate, wherein a second via hole is disposed on the second insulating layer, and an orthographic projection of the second via hole on the base substrate covers an orthographic projection of the interval between two adjacent conductive line segments on the base substrate; and a first connection portion disposed on a side of the second insulating layer away from the base substrate, wherein the first connection portion electrically connects two adjacent conductive line segments through the second via hole and the first via hole.

* * * * *